United States Patent [19]

Ohsawa

[11] 4,101,842
[45] Jul. 18, 1978

[54] DIFFERENTIAL AMPLIFIER

[75] Inventor: Mitsuo Ohsawa, Fujisawa, Japan

[73] Assignee: Sony Corporation, Tokyo, Japan

[21] Appl. No.: 829,962

[22] Filed: Sep. 1, 1977

[30] Foreign Application Priority Data

Sep. 3, 1976 [JP] Japan ............................... 51-105975

[51] Int. Cl.² ............................................. H03F 3/45
[52] U.S. Cl. .................................................. 330/257
[58] Field of Search ................ 330/252, 256, 257, 261

[56] References Cited

U.S. PATENT DOCUMENTS 3,904,976  9/1975  Ahmed .................................. 330/257

Primary Examiner—James B. Mullins
Attorney, Agent, or Firm—Lewis H. Eslinger; Alvin Sinderbrand

[57] ABSTRACT

A differential amplifier includes differentially connected transistors, a first current mirror circuit used as an active load of the differentially connected transistors, and a second current mirror circuit connected to the common emitter side of the differentially connected transistors so as to reduce an off-set DC current that may be produced at the output terminal of the differentially connected transistors.

8 Claims, 3 Drawing Figures

DIFFERENTIAL AMPLIFIER

BACKGROUND OF THE INVENTION

1. Field of the Invention

The invention relates generally to a differential amplifier and, more particularly, is directed to an improved differential amplifier with a current mirror type constant current circuit.

2. Description of the Prior Art

It has been known to provide a differential amplifier with a current mirror circuit as its load and which is used in a stereo demodulation circuit or the like, for example, as disclosed in my U.S. patent application Ser. No. 731,018, filed Oct. 8, 1976, for "MPX Stereo Signal Demodulator," and which has a common assignee herewith. In general, such known differential amplifier reduces its load current and common impedance current simultaneously to stop the amplification operation of the differential amplifier (so-called muting operation) when a feeble input signal is applied thereto. In such case, if there is a difference or so-called off-set current between the load current and the common impedance current, the output DC voltage of the differential amplifier fluctuates and a noise may be produced. Therefore, it is necessary to reduce the mentioned off-set current as much as is possible.

OBJECTS AND SUMMARY OF THE INVENTION

Accordingly, it is generally an object of the invention to provide a differential amplifier free from the above described defect inherent in the prior art.

More specifically, an object of the invention is to provide a differential amplifier using a constant current circuit of the current mirror type as a load and a common impedance and in which the DC output voltage does not fluctuate even if the load current is changed.

Another object is to provide a differential amplifier current, as aforesaid, in which any DC off-set current is reduced as much as possible.

In accordance with an aspect of this invention, a differential amplifier comprises first and second differentially connected transistors with at least one input terminal and one output terminal connected with the base and collector electrodes of respective ones of said differentially connected transistors; first current mirror circuit means including third, fourth and fifth transistors and a P-N junction connected in parallel with the base-emitter junctions of the third, fourth and fifth transistors and having the same polarity as such base-emitter junctions, a first reference DC terminal connected with the emitter electrodes of the third, fourth and fifth transistors, and means connecting each output terminal to the collector electrode of a respective one of the third and fourth transistors; second current mirror circuit means including first, second and third pairs of Darlington-connected transistors with the first and second pairs of Darlington-connected transistors having the collector electrodes thereof connected in common to the emitter electrodes of the first and second differentially connected transistors, each of the pairs of Darlington-connected transistors having the emitter electrode of one of the transistors thereof connected to the base electrode of the other transistor of the respective pair, a second reference DC terminal connected to the emitter electrodes of the other transistors of the pairs of Darlington-connected transistors, and the base electrodes of said one transistors of the first, second and third pairs of Darlington-connected transistors being connected together; circuit means connecting the collector electrode of said other transistor of the third pair of Darlington-connected transistors to the base electrode of said one transistor of the third pair of Darlington-connected transistors and to the collector electrode of the fifth transistor; and current source means connected to the P-N junction at the side of the latter remote from the first reference DC terminal.

The above, and other objects, features and advantages of the invention, will become apparent from the following detailed description which is to be read in conjunction with the accompanying drawings.

DESCRIPTION OF THE PREFERRED EMBODIMENTS

In order that the present invention may be fully appreciated, the problem to be solved by the invention will be described in detail with reference to the known or prior art differential amplifier shown in FIG. 1. Such known differential amplifier is shown to generally comprise a pair $D_1$ of differentially connected transistors $Q_1$ and $Q_2$, a first constant current circuit $CM_1$ of current mirror construction which is connected to the output side of the differentially connected transistors $Q_1$ and $Q_2$, and a second constant current circuit $CM_2$ of current mirror construction which is connected to the common connection point of the emitters of differentially connected transistors $Q_1$ and $Q_2$. It is desirable that, in the case of a differential amplifier as shown in FIG. 1, the current $I_1$ flowing to an output terminal from circuit $CM_1$ should be equal, if possible, to the current $I_2$ flowing from the output terminal to circuit $CM_2$.

Figure 1:
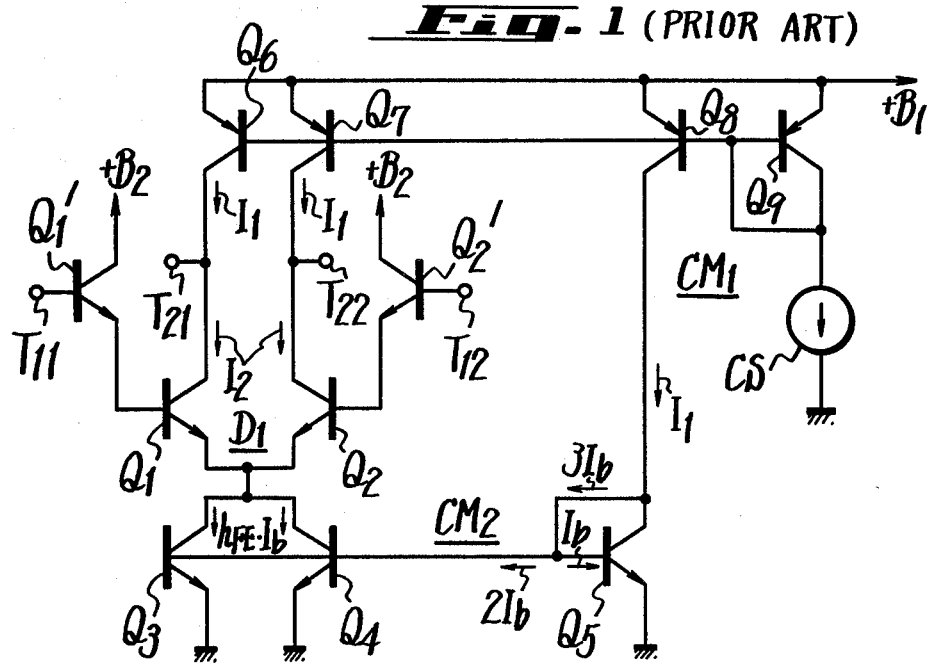
FIG. 1 is a circuit diagram showing a prior art differential amplifier.

Referring in greater detail to FIG. 1, it will be seen that reference letters $T_{11}$ and $T_{12}$ designate input terminals of the differential amplifier to which input signals of opposite polarity are applied, and reference letters $T_{21}$ and $T_{22}$ designate output terminals from which output signals of opposite polarity are derived. The differentially connected amplifying transistors $Q_1$ and $Q_2$ are shown to be of the NPN-type and to have their base electrodes connected to the emitter electrodes of NPN-type amplifying transistors $Q'_1$ and $Q'_2$, respectively. The input terminals $T_{11}$ and $T_{12}$ are respectively connected to the base electrodes of transistors $Q'_1$ and $Q'_2$ which have their collector electrodes connected to a DC voltage source $+ B_2$. The output terminals $T_{21}$ and $T_{22}$ are shown to be led out from the collector electrodes of transistors $Q_1$ and $Q_2$, respectively.

The constant current circuit $CM_1$ of current mirror circuit construction is shown to include PNP-type transistors $Q_6$, $Q_7$, $Q_8$ and $Q_9$ which have their base electrodes connected to each other, while the collector electrodes of such PNP-type transistors are all connected to a voltage source or reference DC terminal $+ B_1$. The transistors $Q_6$ and $Q_7$ have their collector electrodes connected to the collector electrodes of transistors $Q_1$ and $Q_2$, respectively, to form a constant current source as an active load. The transistor $Q_9$ is diode connected, that is, has its collector and base electrodes connected directly to each other, so that transistor $Q_9$ constituted a P-N junction in parallel with the base-emitter junctions of transistors $Q_6$, $Q_7$ and $Q_8$ and having the same polarity as such base-emitter junctions. The collector electrode of transistor $Q_9$ is grounded through a constant current source CS, and equal collector currents (DC currents) flow through transistors $Q_6$, $Q_7$, $Q_8$ and $Q_9$.

The constant current circuit $CM_2$ of current mirror construction is shown to include NPN-type transistors $Q_3$, $Q_4$ and $Q_5$. The transistors $Q_3$ and $Q_4$ have their collector-emitter paths connected between the connection point of the emitters of transistors $Q_1$ and $Q_2$ and the ground to form a constant current source, and transistor $Q_5$ has its collector electrode connected to the collector electrode of transistor $Q_8$ which forms a constant current source equal to that formed by transistors $Q_6$ and $Q_7$. The emitter electrode of transistor $Q_5$ is grounded and its collector and base electrodes are connected together to the base electrodes of transistors $Q_3$ and $Q_4$ in common. In this known differential amplifier, transistors $Q_1$, $Q_2$, $Q_1'$, $Q_2'$, $Q_3$, $Q_4$ and $Q_5$ are selected to have equal characteristics, and transistors $Q_6$, $Q_7$, $Q_8$ and $Q_9$ are selected to have characteristics equal to each other.

The differential amplifier circuit of FIG. 1 has an inherent defect in that a difference may arise between the collector current (DC current) of transistors $Q_6$, $Q_7$ and the collector current (DC current) of transistors $Q_1$, $Q_2$ and, thereby, a substantial off-set current may appear in the output signal at output terminals $T_{21}$ and $T_{22}$. In that case, the off-set current varies exponentially with changes in temperature with the result that the temperature characteristic and operating stability of the known differential amplifier circuit are deteriorated. In connection with the foregoing, the derivation of the off-set current will now be described.

If it is assumed that the collector current (DC current) of transistors $Q_6$, $Q_7$ and $Q_8$ is $I_1$; the collector current (DC current) of transistors $Q_1$ and $Q_2$ is $I_2$; the emitter-grounded current amplification factor of transistors $Q_1$, $Q_2$, $Q_1'$, $Q_2'$, $Q_3$, $Q_4$ and $Q_5$ is $h_{FE}$; and the base current (DC current) of transistors $Q_3$, $Q_4$ and $Q_5$ is $I_b$; then the currents $I_1$ and $I_2$ can be expressed as follows:

$$I_1 = 3I_b + h_{FE} \cdot I_b \qquad (1)$$

$$I_2 = (\frac{h_{FE}}{1 + h_{FE}}) \cdot h_{FE} \cdot I_b \qquad (2)$$

Accordingly, the current ratio $I_2/I_1$ is expressed as follows:

$$\frac{I_2}{I_1} = \frac{1}{1 + (\frac{4}{h_{FE}} + \frac{3}{h^2_{FE}})} \qquad (3)$$

Further, the current difference $I_2 - I_1$ (which will become the off-set current) is expressed as follows:

$$I_1 - I_2 \neq (\frac{3 + 4h_{FE}}{h^2_{FE}}) \cdot I_2 \qquad (4)$$

If, for example, the current $I_2$ has a value of 0.5 mA (milliampere) and $h_{FE}$ is 100, then by means of equation (4) it is determined that $I_1 - I_2$ has a value of about 20.15 μA (microamperes), which is a rather substantial value.

Figure 2:
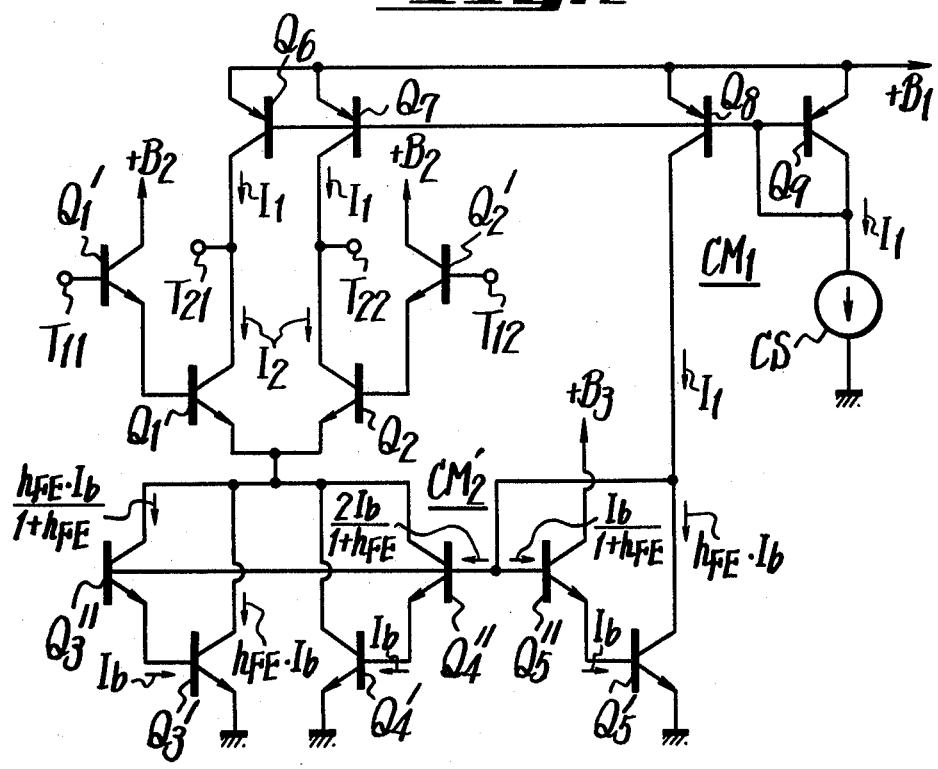
FIG. 2 is a circuit diagram showing an embodiment of a differential amplifier according to the present invention.

Referring now to FIG. 2, it will be seen that, in the differential amplifier accordng to the present invention as there illustrated, those components corresponding to parts of the known differential amplifier described above with reference to FIG. 1 are identified by the same reference letters and numerals and will not be again described herein. Further, it will be seen that the differential amplifier according to this invention, as shown on FIG. 2, differs from the known differential amplifier only in respect to its constant current circuit $OM_2'$ which replaces the constant current circuit $CM_2$ of FIG. 1.

More particularly, in the differential amplifier according to this invention, pairs of Darlington-connected transistors $Q_3'$ and $Q_3''$, $Q_4'$ and $Q_4''$, and $Q_5'$ and $Q_5''$ are employed in the constant current circuit $CM_2'$ in place of the transistors $Q_3$, $Q_4$ and $Q_5$, respectively, of the constant current circuit $CM_2$ in the known differential amplifier of FIG. 1. The transistors $Q_3'$, $Q_3''$, $Q_4'$, $Q_4''$, $Q_5'$ and $Q_5''$ are all NPN-type transistors and are selected to have the same characteristics as transistors $Q_1$, $Q_1'$, $Q_2$ and $Q_2'$. As shown, the collector electrodes of transistors $Q_3'$, $Q_3''$, $Q_4'$ and $Q_4''$ are connected in common to the emitter electrodes of differentially connected transistors $Q_1$ and $Q_2$. The emitter electrodes of transistors $Q_3'$, $Q_4'$ and $Q_5'$ are connected to a reference DC voltage source, for example, to ground as shown, and the emitter electrodes of transistors $Q_3''$, $Q_4''$ and $Q_5''$ are connected to the base electrodes of transistors $Q_3'$, $Q_4'$ and $Q_5'$, respectively. The transitor $Q_5'$ has its collector electrode connected to the collector electrode of transistor $Q_8$ and also directly to the base electrode of transistor $Q_5''$, and the transistor $Q_5''$ has its collector electrode connected to a reference DC voltage source or terminal $+B_3$. Finally, in the constant current circuit $CM_2'$, the base electrodes of transistors $Q_3''$, $Q_4''$ and $Q_5''$ are connected together and, if desired although not shown on FIG. 2, the base electrodes of transistors $Q_3'$, $Q_4'$ and $Q_5'$ may be similarly connected to each other.

The circuit according to this invention as shown on FIG. 2 will now be analyzed in a manner similar to the earlier analysis of the known circuit of FIG. 1. If it is again assumed that the collector current (DC current) of transistor $Q_6$, $Q_7$ and $Q_8$ is $I_1$; the collector current (DC current) of transistors $Q_1$ and $Q_2$ is $I_2$; the emitter-grounded current amplification factor of transistors $Q_1$, $Q_1'$, $Q_2$, $Q_2'$, $Q_3'$, $Q_3''$, $Q_4'$, $Q_4''$, $Q_5'$ and $Q_5''$ is $h_{FE}$; and the base current (DC current) of transistors $Q_3'$, $Q_4'$ and $Q_5'$ is $I_b$; then the currents $I_1$ and $I_2$ can be expressed as follows:

$$I_1 = (h_{FE} + \frac{3}{1 + h_{FE}}) \cdot I_b \qquad (5)$$

$$I_2 = (h_{FE} + \frac{h_{FE}}{1 + h_{FE}}) \cdot (\frac{h_{FE}}{1 + h_{FE}}) \cdot I_b \qquad (6)$$

Thus, the current ratio $I_2/I_1$ is expressed as follows:

$$\frac{I_2}{I_1} \neq \frac{1}{1 + (\frac{3 + 4h_{FE}}{2h^2_{FE} + h^3_{FE}})} \qquad (7)$$

or

-continued $$\frac{I_2}{I_1} \neq \frac{1}{1 + \frac{4}{h^2_{FE}}}$$

Further, the current difference $I_1 - I_2$ (which will become the off-set current) is expressed as follows:

$$I_1 - I_2 \neq \left( \frac{3 + 4h_{FE}}{2h^2_{FE} + h^3_{FE}} \right) \cdot I_2 \quad (8)$$

If, as before, it is assumed that $I_2$ is 0.5 mA and $H_{FE}$ is 100, then it can be determined from equation (8) that the value of $I_1 - I_2$ is about $0.2\mu A$ for the differential amplifier according to this invention as shown on FIG. 2, and such value of $I_1 - I_2$ is seen to be only about 1/100th of the corresponding value of the current difference or off-set current for the previously known differential amplifier of FIG. 1.

Figure 3:
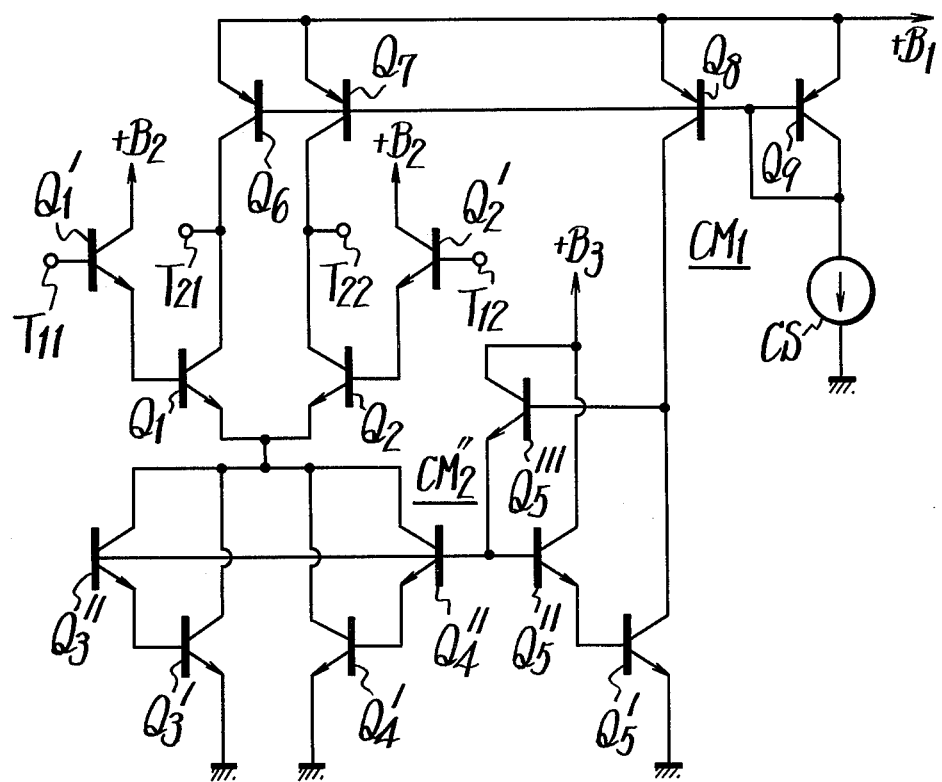
FIG. 3 is a circuit diagram showing another embodiment of a differential amplifier according to the invention.

Referring now to FIG. 3, it will be seen that, in another embodiment of the present invention as there illustrated, the differential amplifier is generally similar to that of FIG. 2 and has its corresponding parts or components identified by the same reference letters and numerals. More particularly, the differential amplifier of FIG. 3 differs from that of FIG. 2 only in that, in the constant current circuit $CM_2''$ of FIG. 3, the collector electrode of transistor $Q_5'$, rather than being directly connected to the base electrode of transistor $Q_5''$, is connected to the base electrode of an additional NPN-type transistor $Q_5'''$ having characteristics equal to those of transistors $Q_5'$ and $Q_5''$. Further, as shown, the collector electrode of transistor $Q_5'''$ is connected to reference DC terminal $\pm B_3$, and the emitter electrode of transistor $Q_5'''$ is connected to the base electrode of transistor $Q_5''$.

With the above described arrangement of the differential amplifier on FIG. 3, if $I_2$ and $h_{FE}$ are assumed to be 0.5mA and 100, respectively, then the value of $I_1 - I_2$ becomes about $0.002\mu A$ which is about 1/1000th of the corresponding current difference $I_1 - I_2$ obtained with the example of the prior art shown on FIG. 1.

It will be apparent from the above that differential amplifiers according to the present invention are characterized by relatively small off-set currents, as compared with differential amplifiers according to the prior art, and that the differential amplifiers according to the invention are therefore possessed of superior temperature characteristics and operating stability.

Although illustrative embodiments of the invention have been described in detail herein with reference to the accompanying drawings, it is to be understood that the invention is not limited to those precise embodiments, and that various changes and modifications may be effected therein by one skilled in the art without departing from the invention as defined in the appended claims.

What is claimed is:

1. A differential amplifier comprising:
   first and second differentially connected transistors each having base, emitter and collector electrodes, at least one input terminal, means connecting each said input terminal with the base electrode of a respective one of said differentially connected transistors, at least one output terminal, and means connecting each said output terminal with the collector electrode of a respective one of said differentially connected transistors;
   first current mirror circuit means including third, fourth and fifth transistors and a P-N junction, each of said third, fourth and fifth transistors having base, emitter and collector electrodes, said P-N junction being connected in parallel with the base-emitter junctions of said third, fourth and fifth transistors and having the same polarity as said base-emitter junctions, a first reference DC terminal, means connecting said emitter electrode of each of said third, fourth and fifth transistors to said first reference DC terminal, and means connecting each said output terminal to the collector electrode of a respective one of said third and fourth transistors;
   second current mirror circuit means including first, second and third pairs of Darlington-connected transistors each having base, emitter and collector electrodes, said first and second pairs of Darlington-connected transistors having the collector electrodes thereof connected in common to the emitter electrodes of said first and second differentially connected transistors, each of said pairs of Darlington-connected transistors having the emitter electrode of one of the transistors thereof connected to the base electrode of the other transistor of the respective pair, a second reference DC terminal connected to the emitter electrodes of said other transistors of said pairs of Darlington-connected transistors, and means connecting together the base electrodes of said one transistors of said first, second and third pairs of Darlington-connected transistors;
   circuit means connecting said collector electrode of said other transistor of said third pair of Darlington-connected transistors to said base electrode of said one transistor of said third pair of Darlington-connected transistors and to the collector electrode of said fifth transistor; and
   current source means connected to said P-N junction at the side of the latter remote from said first reference DC terminal.

2. A differential amplifier according to claim 1; in which each of said first and second transistors in an NPN-type transistor.

3. A differential amplifier according to claim 2; in which each of said third, fourth and fifth transistors in a PNP-type transistor.

4. A differential amplifier according to claim 3; in which said P-N junction is constituted by a diode connected PNP-type transistor.

5. A differential amplifier according to claim 4; in which said Darlington-connected transistors are NPN-type transistors.

6. A differential amplifier according to claim 5; in which a third reference DC terminal is connected to the collector electrode of said one transistor of the third pair of Darlington-connected transistors.

7. A differential amplifier according to claim 6; in which said collector electrode of the other transistor of said third pair of Darlington-connected transistors is connected directly to said base electrode of said one transistor of said third-pair of Darlington-connected transistors.

8. A differential amplifier according to claim 6; in which said circuit means connecting the collector and base electrodes of said other and one transistors, respectively, of said third pair of Darlington-connected transistors includes an additional transistor having base and emitter electrodes connected to said collector and base electrodes, respectively, of said other and one transistor, respectively, of said third pair of Darlington-connected transistors, and said additional transistor further has a collector electrode connected to said third reference DC terminal.

* * * * *